(12) United States Patent
DeCosta

(10) Patent No.: US 9,502,810 B2
(45) Date of Patent: Nov. 22, 2016

(54) RECESSED ELECTRICAL BOXES

(71) Applicant: Thomas DeCosta, Westport, MA (US)

(72) Inventor: Thomas DeCosta, Westport, MA (US)

( * ) Notice: Subject to any disclaimer, the term of this patent is extended or adjusted under 35 U.S.C. 154(b) by 0 days.

(21) Appl. No.: 14/757,863

(22) Filed: Dec. 24, 2015

(65) Prior Publication Data

US 2016/0190785 A1 Jun. 30, 2016

Related U.S. Application Data

(63) Continuation of application No. 13/506,136, filed on Mar. 29, 2012, now Pat. No. 9,263,863.

(51) Int. Cl.
| | | |
|---|---|---|
| H01H 47/00 | (2006.01) |
| H01R 13/502 | (2006.01) |
| H02G 1/00 | (2006.01) |
| H01R 13/70 | (2006.01) |
| H01R 24/30 | (2011.01) |
| H01R 27/02 | (2006.01) |
| H02G 3/12 | (2006.01) |
| H05K 5/06 | (2006.01) |
| H02G 3/14 | (2006.01) |
| H01R 107/00 | (2006.01) |

(52) U.S. Cl.
CPC ............ *H01R 13/502* (2013.01); *H01R 13/70* (2013.01); *H01R 24/30* (2013.01); *H01R 27/02* (2013.01); *H02G 1/00* (2013.01); *H02G 3/12* (2013.01); *H02G 3/121* (2013.01); *H02G 3/14* (2013.01); *H05K 5/06* (2013.01); *H01R 2107/00* (2013.01)

(58) Field of Classification Search
CPC .................................. H02G 5/00; H01B 7/30
USPC ......................................................... 307/147
See application file for complete search history.

(56) References Cited

U.S. PATENT DOCUMENTS

| | | | | |
|---|---|---|---|---|
| 4,255,746 A * | 3/1981 | Johnson | ............. | F21V 33/0076 307/115 |
| 5,693,909 A * | 12/1997 | McEwen | ................ | H02G 3/088 174/58 |
| 6,956,169 B1 * | 10/2005 | Shotey | ................... | H02G 3/121 174/50 |
| 6,967,284 B1 * | 11/2005 | Gretz | ..................... | H02G 3/125 174/50 |
| 8,168,887 B2 * | 5/2012 | Phillips | ................. | H02G 3/126 174/481 |
| 2011/0021066 A1 * | 1/2011 | Squires | ................. | H01R 24/70 439/502 |

* cited by examiner

*Primary Examiner* — Rexford Barnie
*Assistant Examiner* — Joseph Inge

(57) ABSTRACT

The present invention discloses a recessed electrical box for locating a pre-wired electrically isolated power source or electrically isolated electronic equipment interior to a wall. The recessed box allows for mounting externally to the enclosure, to create space internal to the enclosure, and for visual isolation.

7 Claims, 13 Drawing Sheets

RECESSED ELECTRICAL BOXES

CROSS-REFERENCE TO RELATED APPLICATIONS

This application claims priority to U.S. Provisional Application No. 61/516,768 filed 7 Apr. 2011 and U.S. Provisional Application No. 61/630,677 filed 16 Dec. 2011, and U.S. Utility application Ser. No. 13/506,136 filed 29 Mar. 2012.

FIELD OF THE INVENTION

The present invention relates to an apparatus for locating electrical devices including pre-wired electrically isolated power sources deep within a walls interior.

BACKGROUND OF THE INVENTION

Some electrical appliances, particularly flat screen televisions, are mounted directly to the wall, so that externally connected plugs protruding out of the wall plate interfere with mounting the television in flat abutment with the surface of the wall.

There exists a need for an apparatus for positioning in-wall power such as electrically isolated receptacles, that are pre-wired, deep within a walls interior. An electrical box that can facilitate the mounting of such receptacles exterior to the box creates more space internal to the wall for isolating plugs and connectors. An electrical box that facilitates the mounting of other components such as speakers etc, and that includes a one piece enclosure that is adaptable for the placement of grills, etc, for a modern flush mounted look is also desirable.

SUMMARY OF THE INVENTION

The foregoing and other problems are overcome, and other advantages are realized, in accordance with the disclosed, alternative embodiments of these teachings.

The recessed box of the present invention is utilized to install electrical components behind a wall, such that the components are recessed within the wall. In one embodiment pre-wired electrically isolated female and male receptacles combined with the recessed box enclosures allow for the input and output receptacles to be mounted deep inside a wall for visual isolation of receptacle outlets and associated plugs/connectors that may also be present in the enclosure. Since the receptacles are encased and pre-wired, they are not required to be mounted internal to an electrical box for electrical isolation. This allows for the receptacles to be mounted externally to the electrical box enclosure, creating additional space within the box necessary for hiding connectors and the like.

Other electrical components and/or audio components may be mounted to the recessed box, and the recessed box can be mounted with a grille in place for applications were it is not desirable to visually see inside the recessed box.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENTS

While certain embodiments of the present invention have been illustrated and described herein, the present invention should not be limited to such illustrations and descriptions. It should be apparent to those skilled in the art that changes and modifications may be incorporated and embodied as part of the present invention and are within the scope of the claims.

Figure 1:
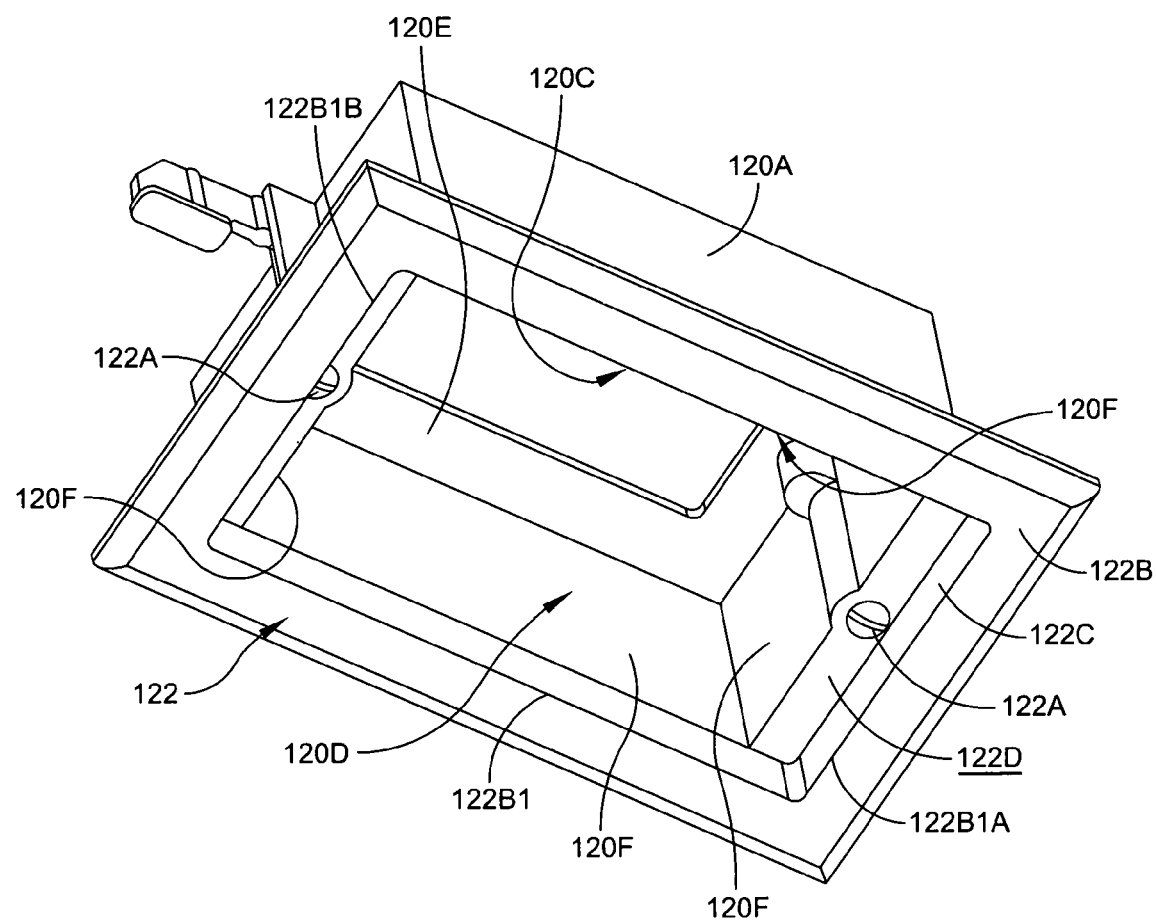
FIG. 1-3 illustrates a single gang recessed electrical box of the present invention.
Figure 2:
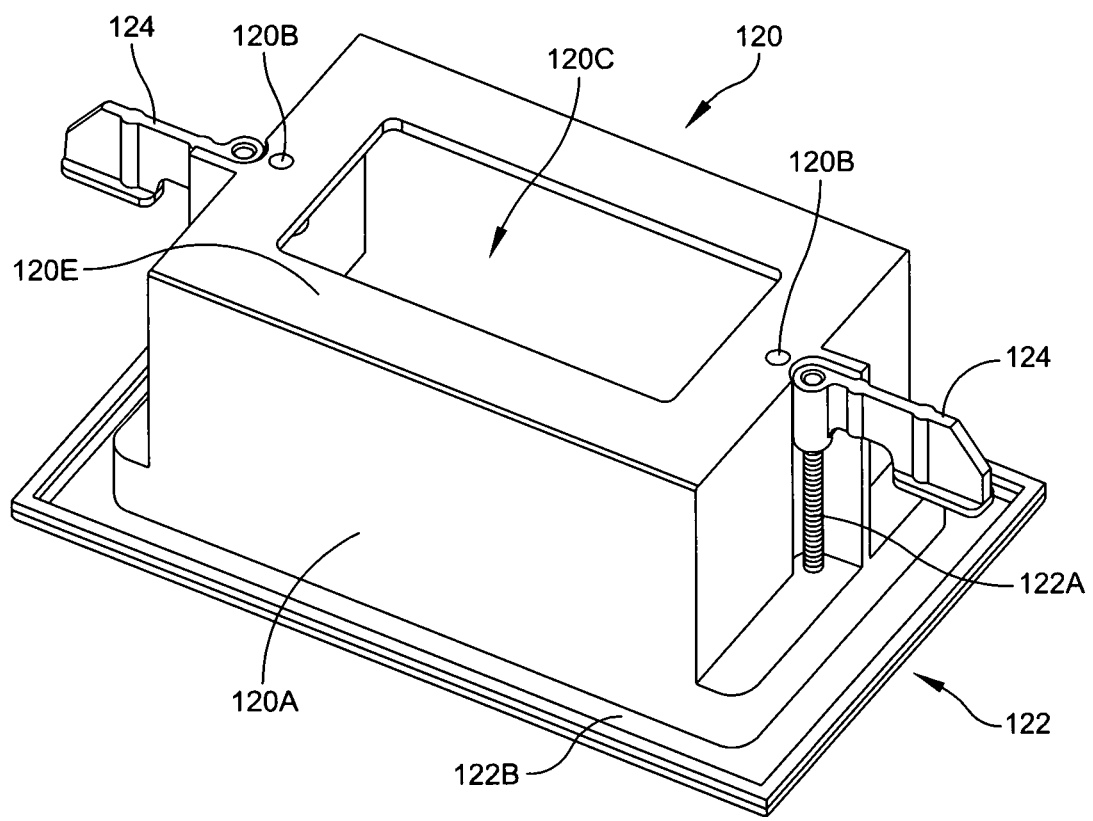
Figure 3:
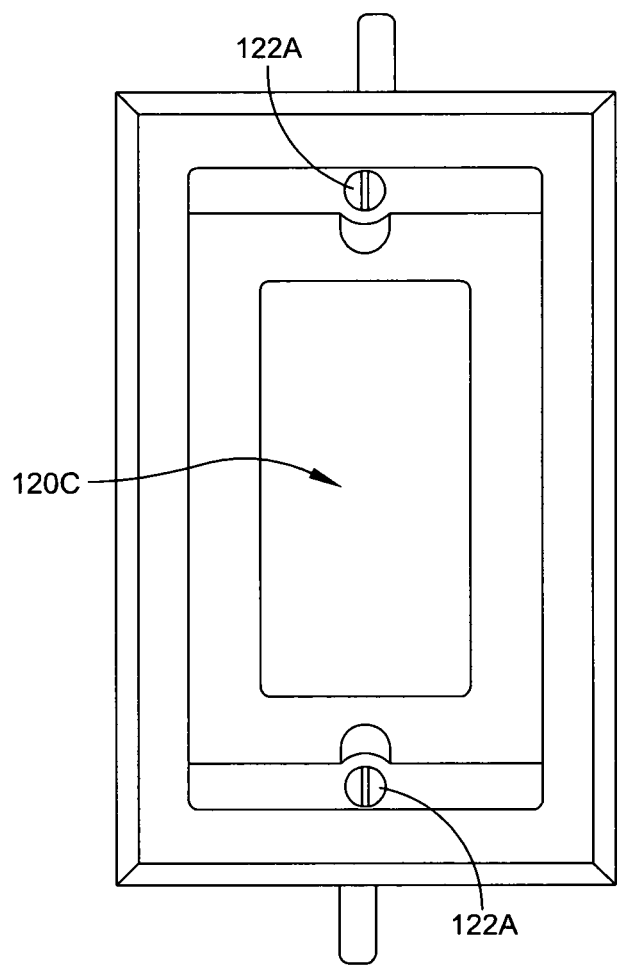

FIGS. 1-7 illustrate various embodiments of recessed electrical boxes or "deep Boxes", that can be utilized with the present invention. Referring to FIGS. 1-3, the single gang recessed electrical box 120 includes an integrated face plate 122 with a flange 122B that extends outward beyond the periphery of box 120 exterior surface 120A. The box 120 includes wall mounting claws 124 that are adjustable to engage drywall or the like via positioning screws 122A. The box includes connection apertures 120B for securing any of the various embodiments of encased receptacles discussed herein. Opening 120C is approximately dimensioned to the dimensions of the receptacle front surface 130 after mounting over opening 120C, and is smaller than opening 120D. As illustrated in FIG. 1, recessed box 120 includes an interior surface that projects rearward of opening 120D up to a rear panel 120E. Rear panel 120E extends inward from sides 120F of the interior surface and defines opening 120C. Flange 122B inner periphery 122B1 defines opening 120D. A grille cover seating surface 1220 extends inward from the inner periphery 122B1 peripheral edge. An orthogonal surface stop 122D provides an abutment to position an optional grille cover 130 within opening 120D.

Figure 12:
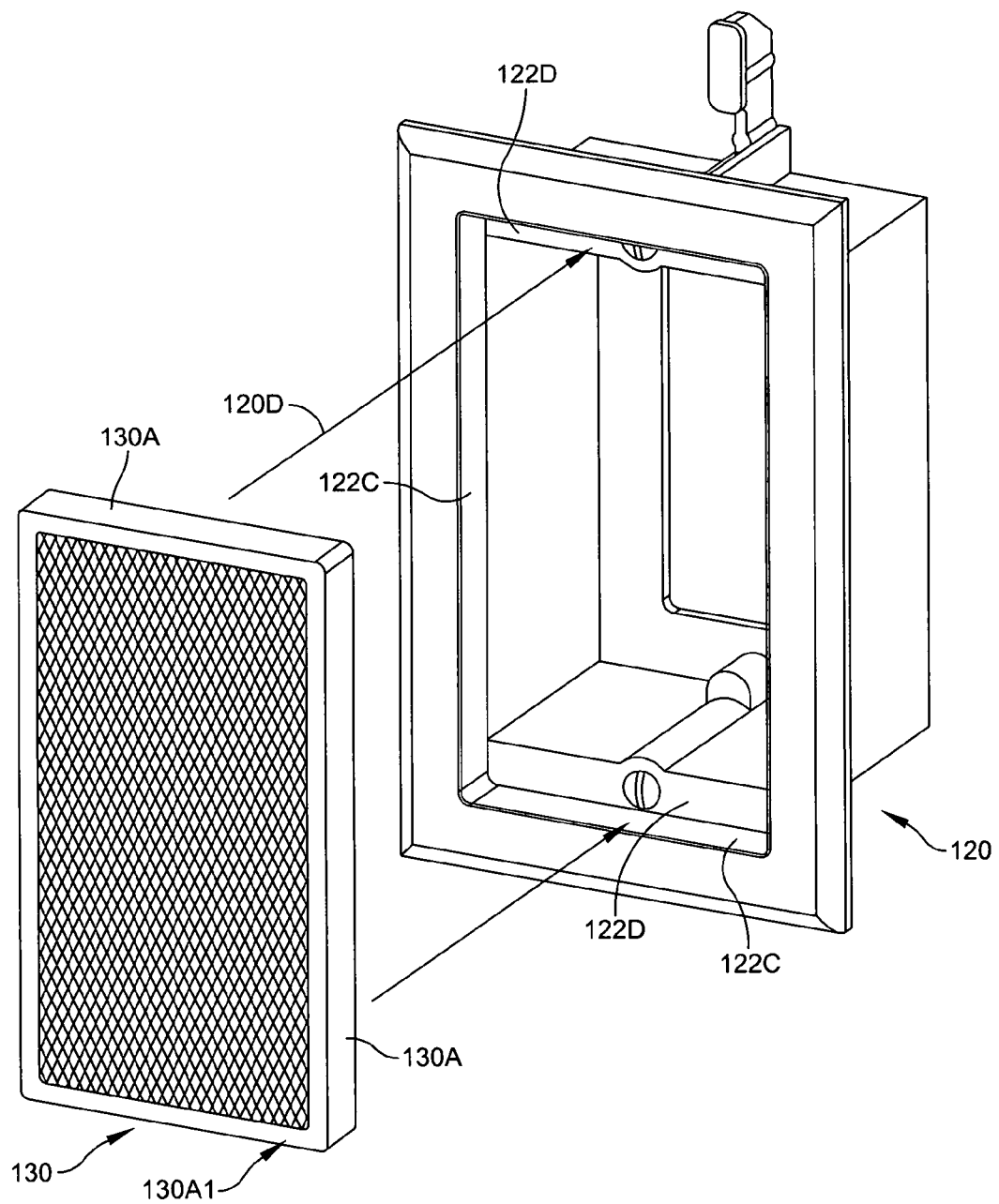
FIGS. 12 and 13 illustrate the recessed electrical box of the present invention in combination with a grille cover.
Figure 13:
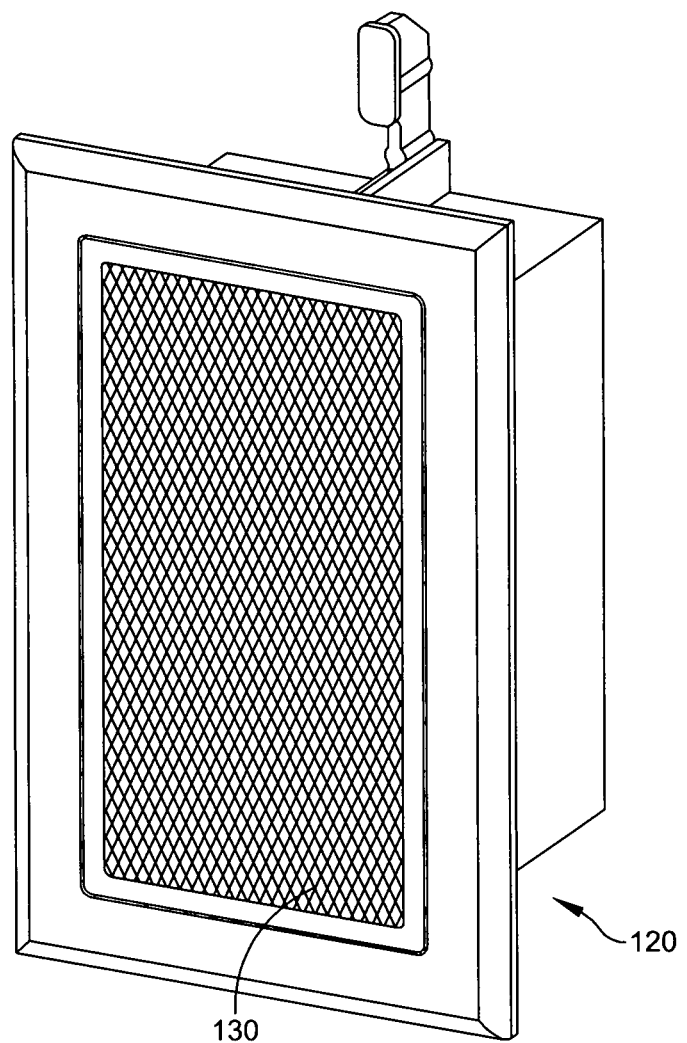

As illustrated in FIG. 12, a grille cover 130 may be placed within opening 120D with grille cover 130, frame 130A1, side surfaces 130A slideably engaging seating surfaces 122C up to a point where grille cover 130 is secured against surfaces 122D.

Figure 10:
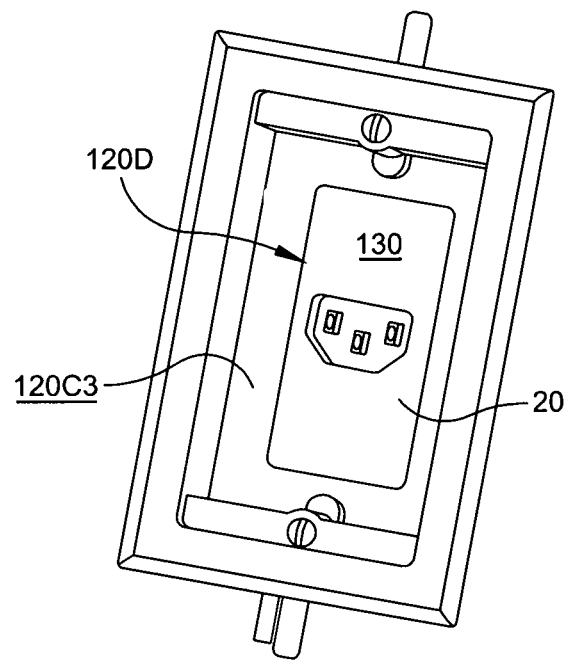
Figure 10:
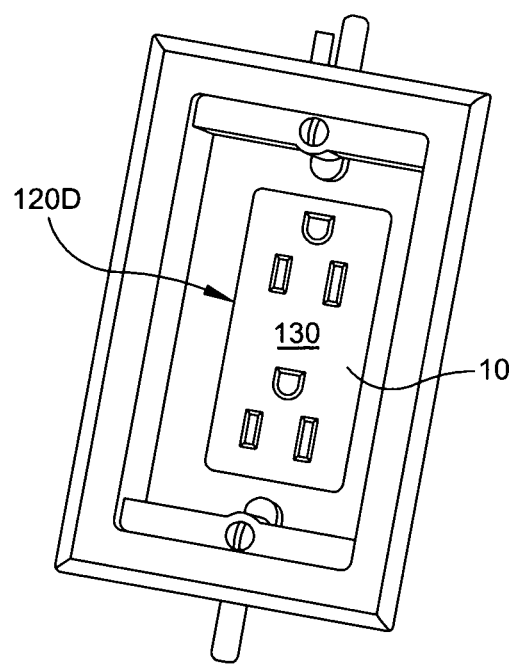
Figure 11:
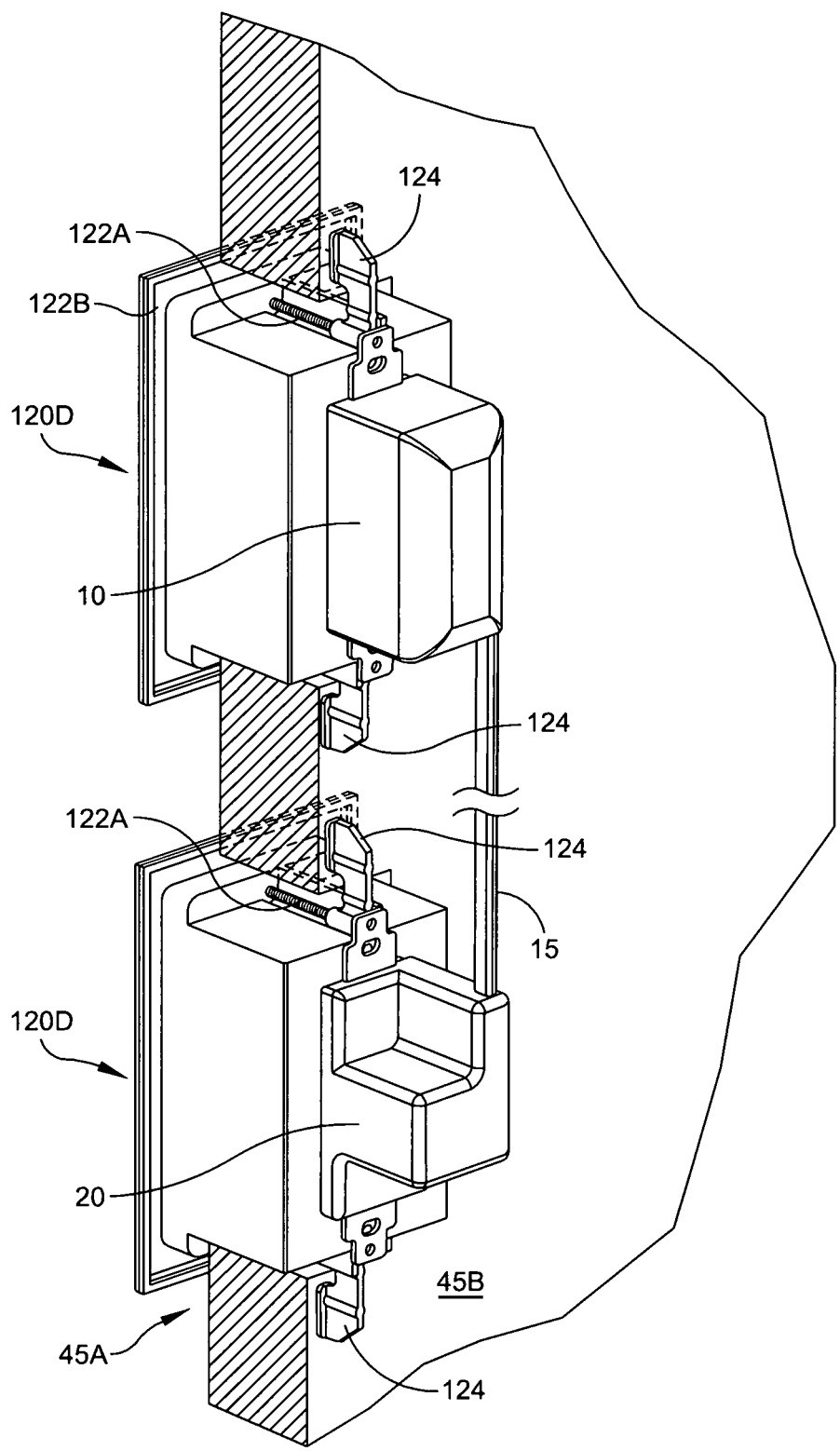
FIG. 11 illustrates an encased receptacle of the present invention in combination with a recessed electrical box of the present invention mounted to a wall.

Since the electrical receptacles are electrically isolated and pre-wired in one of the various forms described herein, they can be mounted external to recessed electrical box 120, as illustrated in FIGS. 8-11. This creates a deep opening within the wall, as illustrated in FIG. 11.

Encased receptacles that can be utilized with the recessed electrical boxes of the present invention may include both power input and power output, and coupling 15 which are electrically insulated and pre-wired to meet applicable building codes.

The encased receptacles 10 and 20 further include mounting frames 25. The frames may be overmolded, or externally affixed to receptacles 10 and 20. The Mounting frames 25 include tab connection holes 25A. In the preferred embodiment, the mounting frames 25 are substantially co-planer with the front face of receptacles 10 and 20.

As illustrated in FIG. 10, a larger front opening 120D is of sufficient length and width to allow access to the mounted receptacles 10 located inward of opening 120D. As illustrated in FIG. 11, in the field, a hole would be cut in the wall at a dimension less than the periphery of face plate 122, flange 122B. Utilizing the engagement claws 124 against the interior wall mounting surface 45B by turning the positioning screws 122A, the claws would force the Flange 122B against the wall surface 45B and bringing flange 122B in contact with exterior wall surface 45A for a secure fit.

Figure 4:
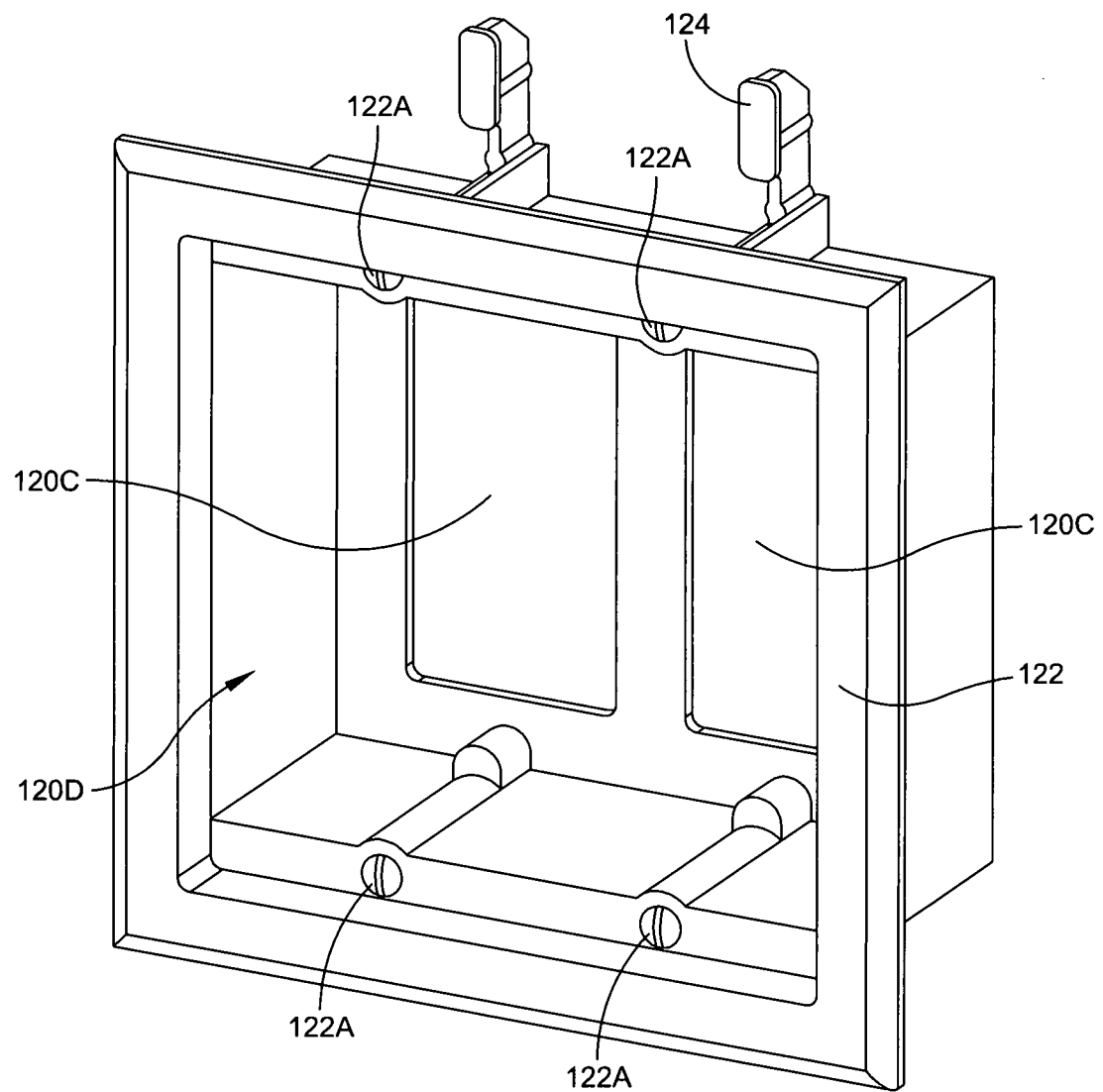
FIG. 4-5 illustrates a double gang recessed electrical box of the present invention.
Figure 5:
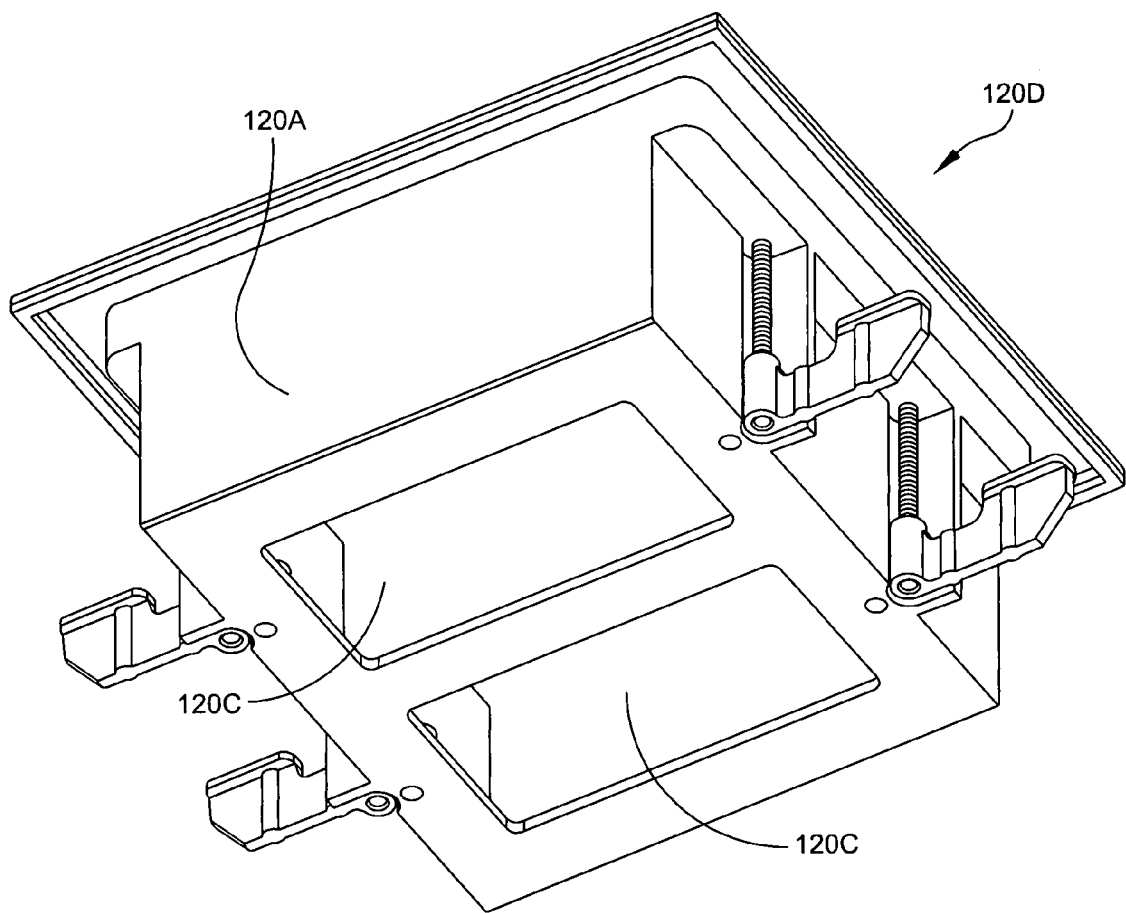
Figure 6:
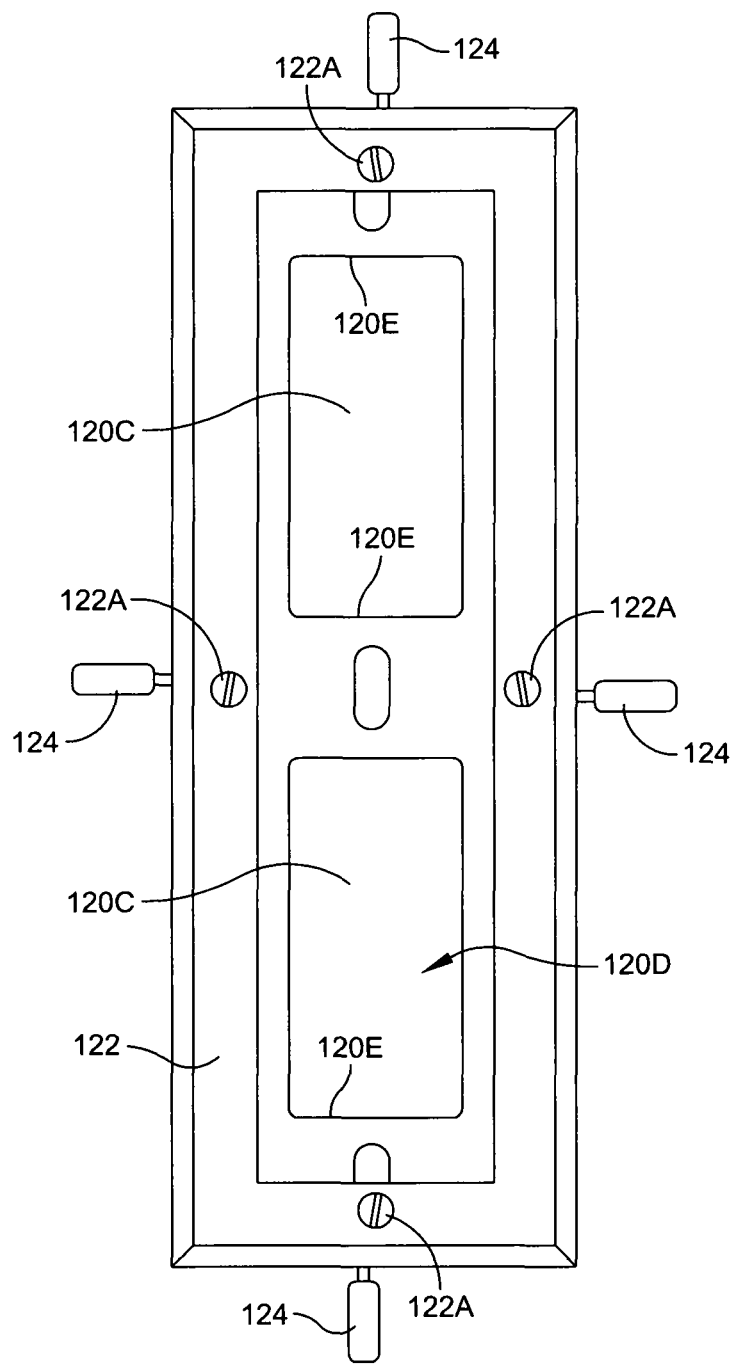
FIGS. 6-7 illustrates an alternative embodiment of a double gang recessed electrical box of the present invention.
Figure 7:
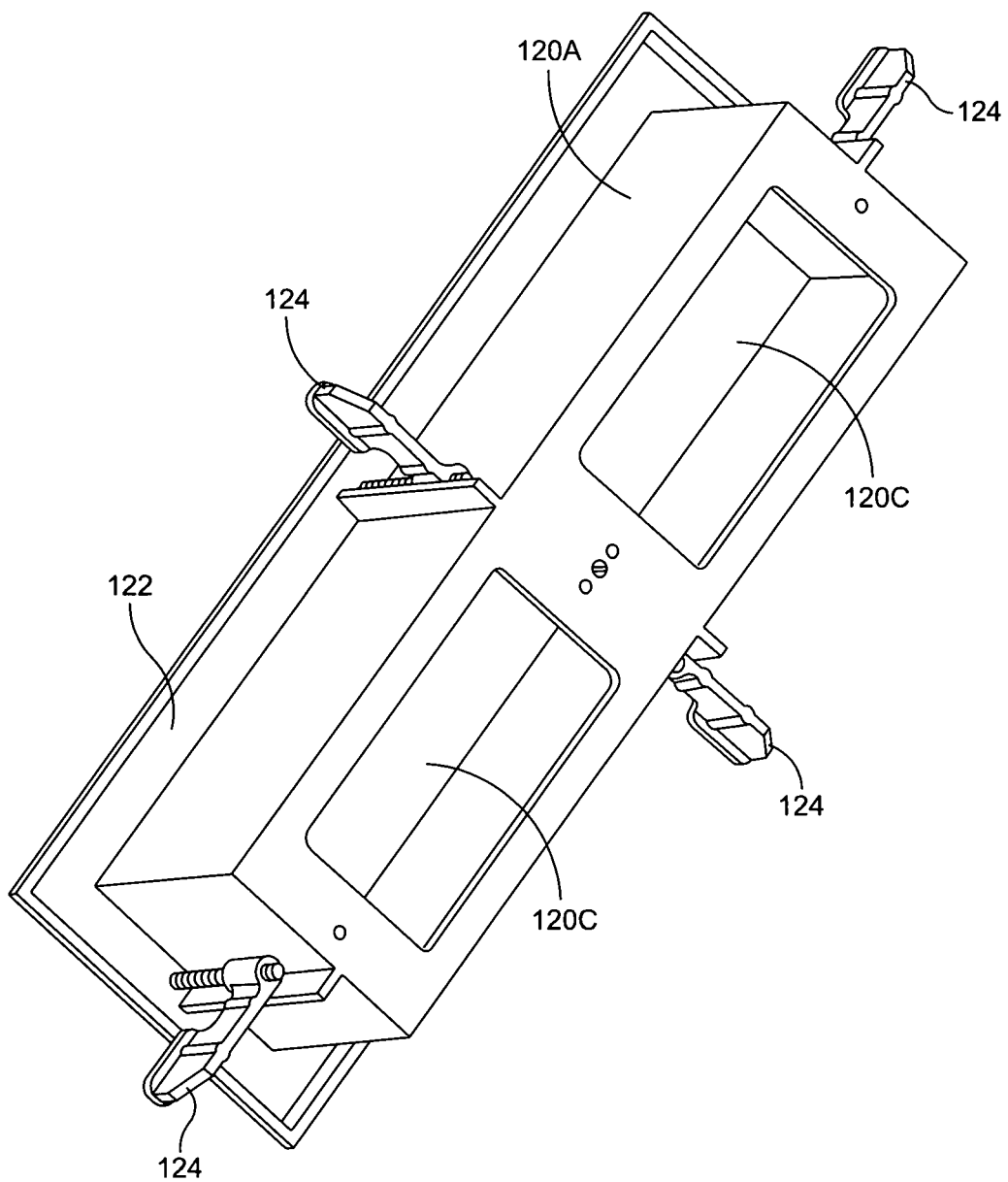
Figure 8:
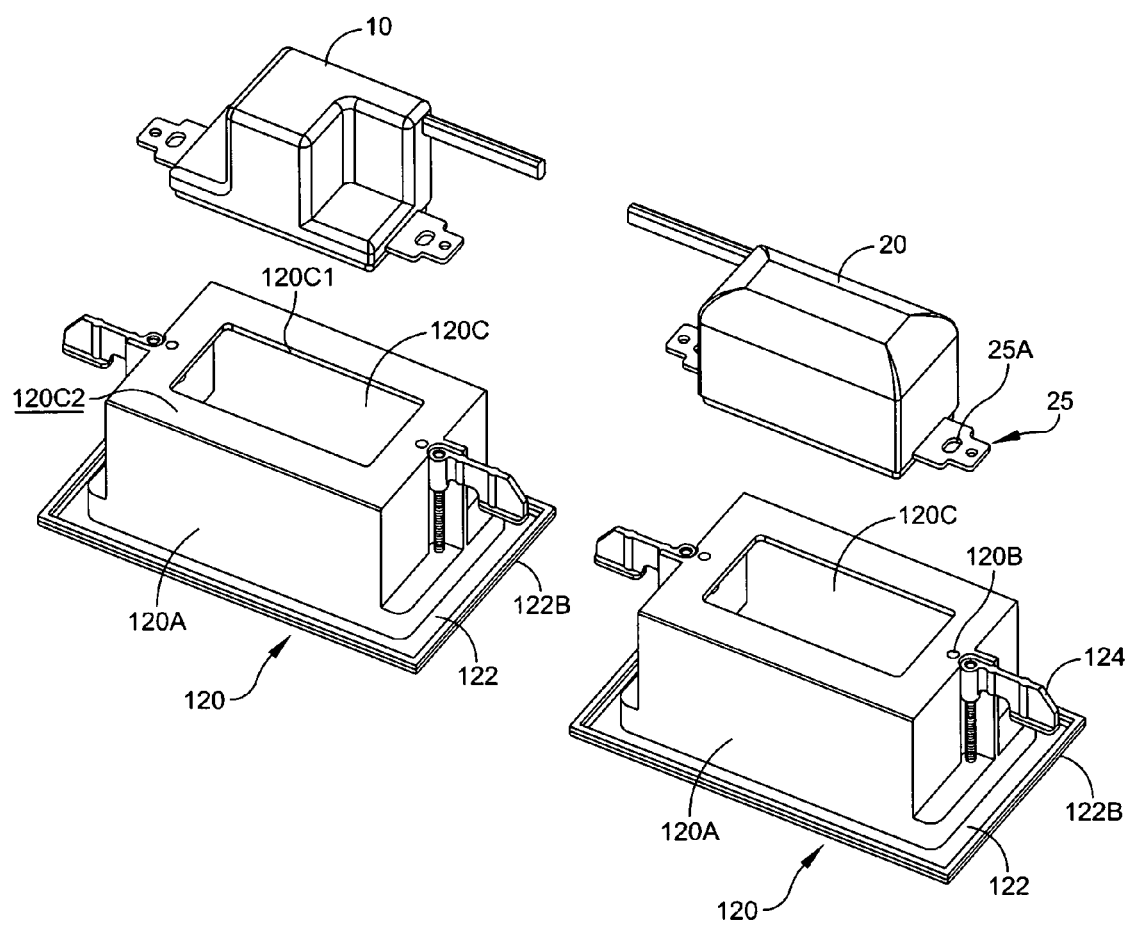
FIGS. 8-10 illustrate an encased receptacle in combination with a recessed electrical box of the present invention.
Figure 9:
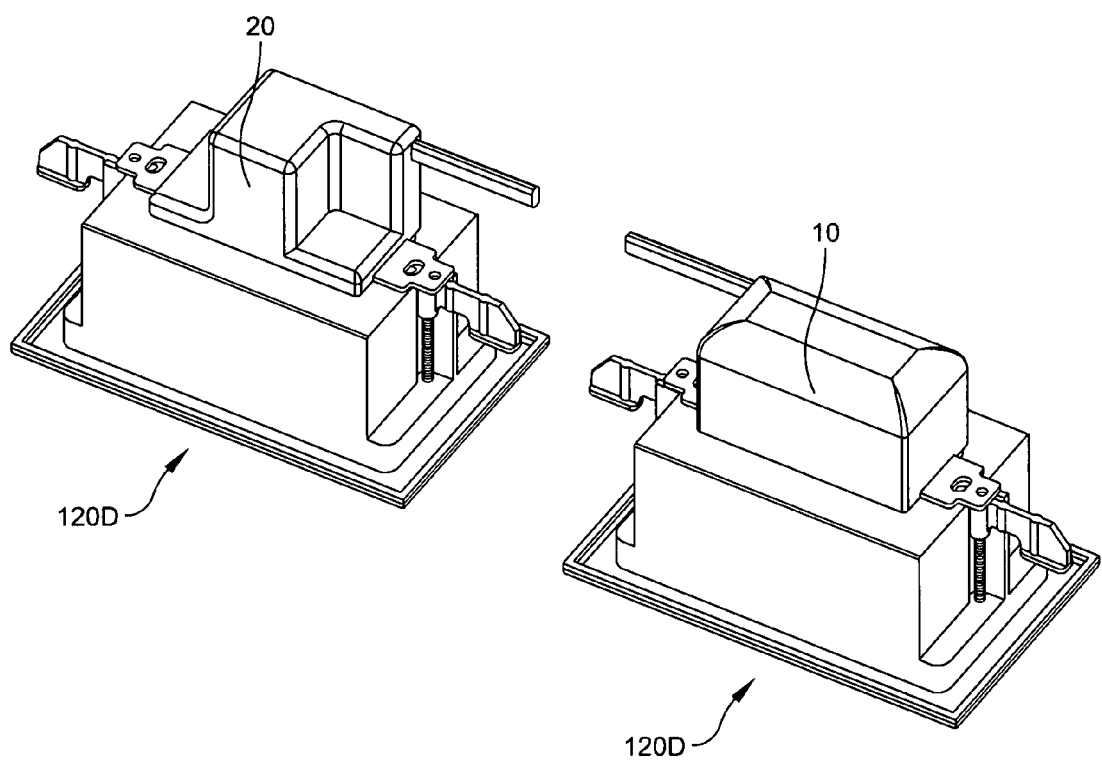

FIGS. 4-5 illustrates a double gang "deep box" having the same functionality for the respective elements as described above, and further illustrates multiple openings 120C, in rear panel 120E. FIGS. 6-7 illustrate an alternative embodiment of the double gang recessed electrical box having the same functionality for the respective elements as described above. It is understood that the exterior surfaces 120A that defines the rearward projection of the recessed boxes may be sloped at various angles for particular installation requirements without departing from the scope of the present invention.

I claim:

1. A recessed electrical box comprising,
a first opening and a second smaller opening, positioned rearward of said first opening;
an interior surface having sides that project rearward from said first opening up to a rear panel, said sides further including an exterior surface;
said rear panel extending inward from each of said rearward projecting sides of said interior surface to a peripheral edge, said peripheral edge of said rear panel defining said smaller second opening,
wherein said first opening of said recessed electrical box includes a peripheral edge and a flange, said flange extending laterally from said peripheral edge;
wherein said first opening further includes a seating surface, said seating surface extending inward from said first opening peripheral edge to a surface stop, said surface stop having a front face and a rearward extending side portion, said rearward extending side portion extending to said rear panel.

2. A recessed electrical box as in claim 1, wherein said rear panel comprises a plurality of said smaller second openings.

3. A recessed electrical box as in claim 1, wherein said side exterior surface further comprises at least one engagement claw mounted thereon, said engagement claw for securing said recessed electrical box to a wall, said wall having an interior hidden surface and an exterior visible surface.

4. A recessed electrical box as in claim 3, wherein said engagement claws are adjustable inward towards said wall interior hidden surface forcing said flange towards said exterior visible surface to seat said flange and secure said electrical boxes within said interior of said wall.

5. A recessed electrical box as in claim 1, wherein said rearward projecting sides project rearward at an angle.

6. A recessed electrical box as in claim 1, wherein said surface stop is orthogonal to said seating surfaces.

7. A recessed electrical box as in claim 1, further including a grille cover, said grille cover including a frame having peripheral side surfaces for slideable engagement with said seating surface of said first opening, said slideable engagement up to a point when said frame abuts said surface stop.

* * * * *